United States Patent [19]
Shimizu

[11] Patent Number: 5,301,162
[45] Date of Patent: Apr. 5, 1994

[54] SEMICONDUCTOR RANDOM ACCESS MEMORY DEVICE HAVING SHARED SENSE AMPLIFIERS SERVING AS A CACHE MEMORY

[75] Inventor: Tamio Shimizu, Tokyo, Japan

[73] Assignee: NEC Corporation, Tokyo, Japan

[21] Appl. No.: 35,238

[22] Filed: Mar. 23, 1993

[30] Foreign Application Priority Data

Mar. 26, 1992 [JP] Japan .................................. 4-100488

[51] Int. Cl.$^5$ ............................................ G11C 15/04
[52] U.S. Cl. ......................... 365/230.03; 365/189.07; 365/189.08
[58] Field of Search ...................... 365/230.01, 230.03, 365/230.08, 189.05, 189.07, 189.08

[56] References Cited
U.S. PATENT DOCUMENTS 4,675,850 6/1987 Kumanoya et al. ........... 365/230.01
5,226,009 7/1993 Arimoto ................................ 365/49
5,226,139 7/1993 Fujishima et al. ............. 365/189.05

OTHER PUBLICATIONS

H. Niijima et al., "QRAM-Quick Access Memory System", 1990 IEEE, pp. 417-420.

Nikkei Electronics, Mar. 30, 1992, No. 550, pp. 202-203, and a partial translation.
"Using the page mode of dynamic RAMs to obtain a pseudo cache", Microprocessors and Microsystems, vol. 11, No. 9, Nov. 1987, pp. 469-473.

Primary Examiner—Eugene R. LaRoche
Assistant Examiner—Tiep Nguyen
Attorney, Agent, or Firm—Sughrue, Mion, Zinn, Macpeak & Seas

[57] ABSTRACT

A random access memory device has memory cell blocks, row address decoders respectively associated with the memory cell blocks, sense amplifier circuit arrays each shared between two of the memory cell blocks, and a column selecting unit for transferring a data bit from one of the sense amplifier circuit arrays to an output data buffer circuit, a flag generating unit for producing flag signals indicative of memory cell blocks supplying the data bits presently stored in the sense amplifier circuit arrays, and an address discriminating unit operative to examine block and row addresses supplied from the outside thereof to see whether or not an accessed data bit has been already stored in the sense amplifier circuit arrays, thereby allowing the shared sense amplifier circuit arrays to serve as a cache memory.

10 Claims, 7 Drawing Sheets

Fig.7

SEMICONDUCTOR RANDOM ACCESS MEMORY DEVICE HAVING SHARED SENSE AMPLIFIERS SERVING AS A CACHE MEMORY

FIELD OF THE INVENTION

This invention relates to a semiconductor random access memory device and, more particularly, to a semiconductor random access memory device for maintaining parts of data bits in the sense amplifier array.

DESCRIPTION OF THE RELATED ART

A typical example of the semiconductor random access memory device stores data bits in the memory cells, and the data bits are selectively read out from the memory cells through a sense amplifier circuit to the outside thereof in accordance with address signals. Therefore, the read-out sequence contains a selecting stage with a row address decoder, an amplification stage for read-out data bits by sense amplifier circuits and a selecting stage with a column address decoder, and such a serial stages hardly achieve high-speed access.

However, a new technology is recently proposed for a random access memory device, and is featured by data-hold in the sense amplifier circuits incorporated therein. If an accessed data bit is held in the sense amplifier circuits, the accessed data bit is directly supplied from one of the sense amplifier circuits, and the access time is shrunk rather than the read-out from the memory cell array.

Figure 1:
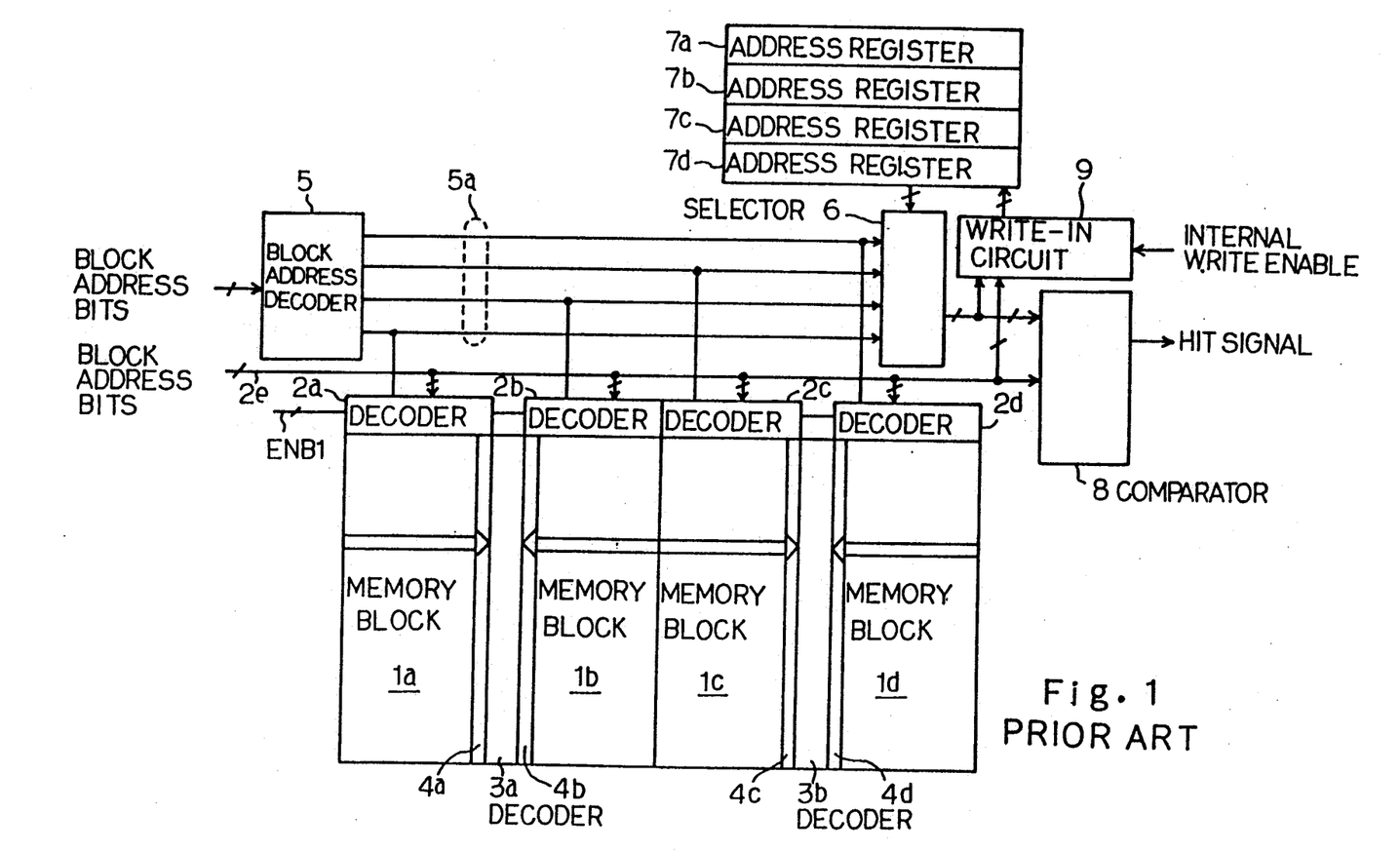
FIG. 1 is a block diagram showing the arrangement of the prior art random access memory device.

FIG. 1 illustrates the random access memory device using sense amplifier circuits as a temporary data storage. Memory cells incorporated in the random access memory device are broken down into four memory blocks 1a, 1b, 1c and 1d, and row address decoders 2a, 2b, 2c and 2d are respectively associated with the four memory blocks 1a to 1d. The memory blocks 1a and 1b share a column address decoder 3a, and another column address decoder 3b is shared between the other memory blocks 1c and 1d. Therefore, each of the memory cells is addressable through the associated row and column address decoders, and differential voltages indicative of data bits are developed by sense amplifier arrays 4a, 4b, 4c and 4d respectively associated with the four memory blocks 1a to 1d. In this instance, each of the sense amplifier arrays 4a to 4d simultaneously develops differential voltages indicative of data bits read out from a row of memory cells.

A block address decoder 5 is provided for the four memory blocks 1a to 1d, and block address bits are decoded so as to selectively drive four block address decoded signal lines 5a. The block address decoded signal lines 5a are respectively coupled with the four memory blocks 1a to 1d, and enable one of the row address decoders 2a to 2d. Row address signal lines 2e distribute row address bits to each of the row address decoders 2a to 2d, and the selected row address decoder is responsive to the row address bits in the presence of an enable signal ENB1.

The block address decoded signal lines 5a are further coupled with a selector 6, and the selector 6 is responsive to the block address decoded signal. Four address registers 7a, 7b, 7c and 7d are respectively associated with the four memory blocks 1a to 1d, and each of the address registers 7a to 7d holds a row address of the associated memory block 1a, 1b, 1c or 1d used in the latest access. The four address registers 7a to 7d are coupled with the four input ports of the selector 6, and the output port of the selector 6 is coupled with a comparator 8. The row address signal lines 2e are coupled with the other input port of the comparator 8, and the comparator compares the row address stored in the selected address register with the row address indicated by the row address bits.

As described hereinbefore, each of the sense amplifier arrays 4a to 4d stores data bits read out from a row of memory cells in the latest access. If the row address stored in the selected address register is matched with the row address indicated by the row address bits, the accessed data bit is stored in the associated sense amplifier array, and the comparator 8 produces a hit signal so that the sense amplifier array directly supplies the accessed data bit to the destination.

Figure 2:
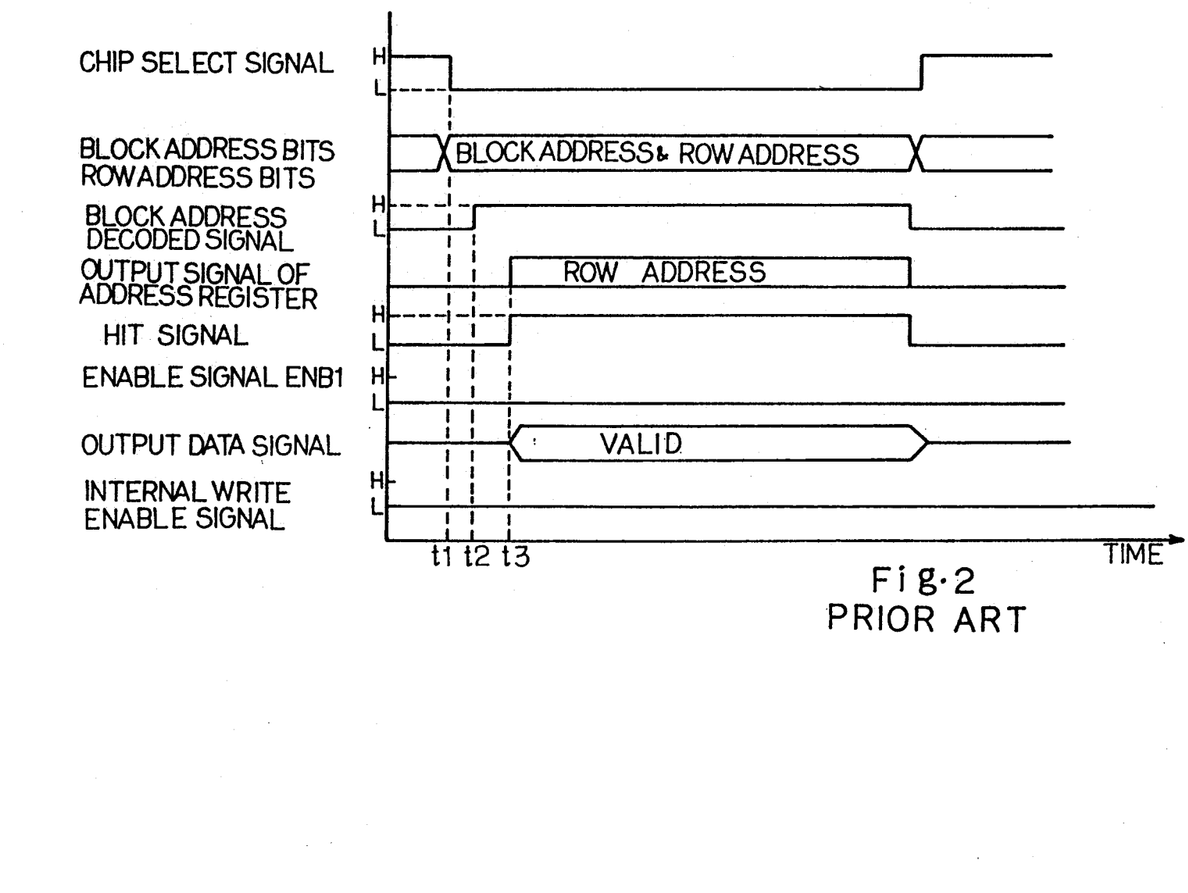
FIG. 2 is a timing chart showing the read-out operation when the accessed data bit is held in the sense amplifier array.
Figure 3:
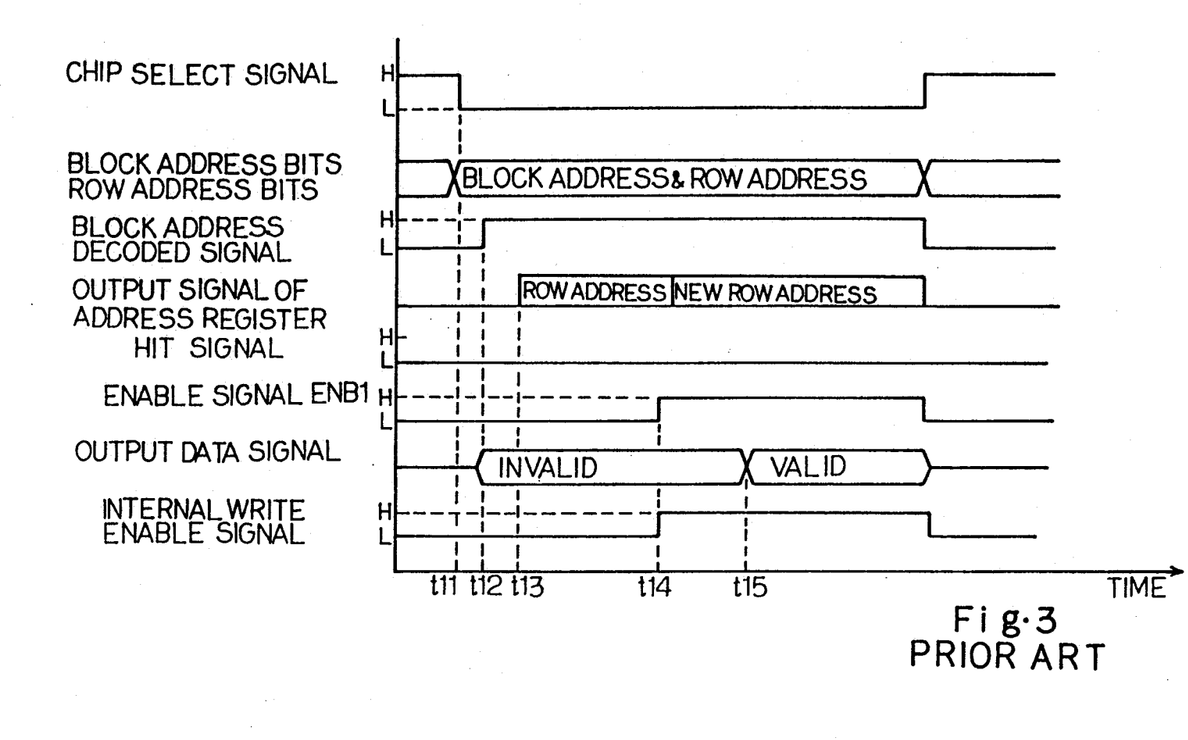
FIG. 3 is a timing chart showing the read-out operation when the sense amplifier array does not hold the accessed data bit

A write-in circuit 9 is provided for the address registers 7a to 7d, and is coupled with the row address signal lines 2e and the selector 6. The write-in circuit 9 is enabled with an internal write enable signal, and writes the row address signal on the signal lines 2e into the address register associated with the memory block assigned the block address indicated by the block address decoded signals. The internal write enable signal is produced in the presence of the high signal, and the row addresses stored in the address registers 7a to 7d are updated every hit FIGS. 2 and 3 show read-out operation of the prior art random access memory device shown in FIG. 1. FIG. 2 illustrates the read-out operation on a data bit held in one of the sense amplifier arrays 4a to 4d. Assuming now that a chip select signal goes down to active low voltage level at time t1, the prior art random access memory device is activated for access, and block address bits and row address bits are respectively transferred to the block address decoder 5 and the row address decoders 2a to 2d.

The block address decoder 5 selectively drives the block address decoded signal lines 5a at time t2, and the block address decoded signal indicative of one of the memory blocks 1a to 1d is supplied to the row address decoders 2a to 2d as well as to the selector 6. However, the row address bits are not decoded in this stage, because the enable signal ENB1 has not been produced yet.

The selector 6 is responsive to the block address decoded signal, and transfers an output signal of the associated address register to the comparator 8 at time t3. The comparator 8 compares the row address bits on the row address signal lines 2e with the output signal of the associated address register, and acknowledges consistence between the row addresses. Then, the comparator 8 produces the hit signal. With the hit signal, the enable signal ENB1 remains inactive low, and the internal write enable signal is not produced. For this reason, the row address bits are not decoded, and one of the column address decoders 3a to 3d allows a column selector (not shown) to directly transfer a data bit held in the associated sense amplifier array to an output data buffer circuit (not shown). Then, the output data buffer circuit produces an output data signal, and the output data signal indicative of the accessed data bit is supplied to the destination.

If, on the other hand, an accessed data bit is not held in the sense amplifier arrays 4a to 4d, the prior art random access memory device traces the read-out sequence shown in FIG. 3. The read-out sequence starts with shift of the chip select signal to the active low level at time t11, and block address bits and row address bits are respectively transferred to the block address decoder 5 and the row address decoders 2a to 2d.

The block address decoder 5 selectively drives the block address decoded signal lines 5a at time t12, and the block address decoded signal indicative of one of the memory blocks 1a to 1d is supplied to the row address decoders 2a to 2d as well as to the selector 6. However, the row address bits are not decoded in this stage, because the enable signal ENB1 has not been produced yet.

The selector 6 is responsive to the block address decoded signal, and transfers an output signal of the associated address register to the comparator 8 at time t13. The comparator 8 compares the row address bits on the row address signal lines 2e with the output signal of the associated address register. However, the comparator 8 does not produce the hit signal, because the row addresses are inconsistent with one another.

The enable signal ENB1 is shifted from the inactive low level to the active high level at time t14, and the internal write enable signal is concurrently produced. The write-in circuit 9 is enabled with the internal write enable signal, and the row address bits on the signal lines 2e are memorized in the address register associated with the memory block indicated by the block address decoded signal.

On the other hand, one of the row address decoders 2a to 2d is enabled in the concurrent presence of the block address decoded signal and the enable signal ENB1, and data bits are read out from a row of memory cells assigned the row address after precharging and equalization. The read-out data bits are respectively represented by differential voltages, and the differential voltages are developed by the associated sense amplifier array. Thereafter, the sense amplifier array holds new data bits in the form of differential voltage. The associated column address decoder causes the column selector (not shown) to transfer one of the differential voltages indicative of the accessed data bit to the output data buffer circuit (not shown), and the output data signal becomes valid at time t15.

Thus, the prior art random access memory device uses the sense amplifier arrays 4a to 4d as a cache memory, and shrinks the access time. However, this technology is not available for shared sense amplifier arrays.

In detail, the prior art random access memory device is equipped with the four sense amplifier arrays 4a to 4d exclusively used by the four memory blocks, and such an exclusive usage allows the sense amplifier arrays to serve as the cache memory. While the random access memory device is relatively small in memory capacity, the exclusive usage is not problem. However, the sense amplifier circuits are increased together with the memory capacity, and such an advanced random access memory device is hardly integrated on a relatively small semiconductor chip. One of the attractive solution is shared sense amplifier circuits. In this instance, the sense amplifier circuits are shared between two memory cell blocks, and the sense amplifier circuits are decreased to a half. The shared sense amplifier circuits are attractive in view of semiconductor chip size. However, the shared sense amplifier circuits can not be used as a cache memory, because the correspondence between data bits and memory blocks are destroyed.

SUMMARY OF THE INVENTION

It is therefore an important object of the present invention to provide a semiconductor random access memory device which has shared sense amplifier circuits available as a cache memory.

To accomplish the object, the present invention proposes to memorize memory blocks already supplied data bits to shared sense amplifier circuits.

In accordance with one aspect of the present invention, there is provided a random access memory device fabricated on a single semiconductor chip, comprising: a) a plurality of memory cell blocks each implemented by a plurality of memory cells arranged in rows and columns, block addresses being respectively assigned to the plurality of memory cell blocks, row addresses being respectively assigned to the rows of memory cells of each memory cell block, column addresses being respectively assigned to the columns of memory cells of each memory cell block; b) a block selecting means responsive to block address bits for producing a block address decoded signal indicative of the block address assigned to one of the plurality of memory cell blocks; c) a plurality of row selecting means respectively associated with the plurality of memory cell blocks, and selectively enabled in the concurrent presence of a first enable signal and the block address decoded signal for producing a row address decoded signal indicative of a row address assigned to one of the rows of memory cells incorporated in the associated memory cell block; d) a plurality of sense amplifier circuit arrays having sense amplifier circuits, each array shared between two of the plurality of memory cell blocks, and each operative to amplify data signals indicative of data bits read-out from a row of memory cells of one of the plurality of memory cell blocks, the plurality of sense amplifier circuit arrays holding the data signals until data signals are newly supplied thereto; e) a column selecting means responsive to column address bits for selecting one of the data signals held in the sense amplifier circuit arrays associated with the memory cell block indicated by the block address decoded signal; f) a plurality of flag means respectively associated with the plurality of memory cell blocks, and operative to produce flag signals each indicative of whether or not the data bits stored in one of the plurality of sense amplifier circuit arrays are read out from the associated memory cell block; g) a block address discriminating means operative to compare the block address decoded signal with the flag signals for producing a first hit signal when the block address decoded signal is indicative of one of the plurality of memory cell blocks which has already supplied data bits to the associated sense amplifier circuit array; h) a plurality of address storage means respectively associated with the plurality of memory cell blocks, and each storing the row address assigned to one of the rows of memory cells selected from the associated memory cell block in the latest access; i) a row address discriminating means operative to compare the row address indicated by the row address bits with the row address stored in each address storage means for producing a second high signal when the row addresses are consistent with each other; j) a control means operative to keep the first enable signal in inactive level in the concurrent presence of the first hit signal and the second hit signal for allowing the column selecting means to transfer the one of the data signals without readout from the memory cell block indicated by the block address decoded signal and to produce the first enable signal and a second enable signal in the absence of at least one of the first hit signal and the second high signal; and k) a write-in means responsive to the second enable signal for writing the row address indicated by the row address bits into the address storage means associated with the memory cell block designated by the block address decoded signal.

In accordance with another aspect of the present invention, there is provided a random access memory device fabricated on a single semiconductor chip, comprising: a) a plurality of memory cell blocks each implemented by a plurality of memory cells arranged in rows and columns, block addresses being respectively assigned to the plurality of memory cell blocks, row addresses being respectively assigned to the rows of memory cells of each memory cell block, column addresses being respectively assigned to the columns of memory cells of each memory cell block; b) a block selecting means responsive to block address bits for producing a block address decoded signal indicative of the block address assigned to one of the plurality of memory cell blocks; c) a plurality of row selecting means respectively associated with the plurality of memory cell blocks, and selectively enabled in the concurrent presence of a first enable signal and the block address decoded signal for producing a row address decoded signal indicative of a row address assigned to one of the rows of memory cells incorporated in the associated memory cell block; d) a plurality of sense amplifier circuit arrays having predetermined sense amplifier circuits, each array shared between two of the plurality of memory cell blocks, and each operative to amplify data signals indicative of data bits read-out from a row of memory cells of one of the plurality of memory cell blocks, the plurality of sense amplifier circuit arrays holding the data signals until data signals are newly supplied thereto; e) a column selecting means responsive to column address bits for selecting one of the data signals held in the sense amplifier circuit arrays associated with the memory cell block indicated by the block address decoded signal; f) a plurality of data source memorizing means respectively associated with the plurality of sense amplifier circuit arrays, and storing respective row addresses assigned to rows of memory cells each selected in the latest access to the associated memory cell block and respective address codes indicative of memory cell blocks respectively containing the rows of memory cells; g) a block address discriminating means operative to compare the block address decoded signal with the address codes to see whether or not the plurality of sense amplifier circuit arrays store the data signals indicative of data bits read out from the memory cell block indicated by the block address decoded signal, the block address discriminating means producing a first hit signal when the plurality of sense amplifier circuit arrays store the data signals indicative of the data bits read out from the memory cell block indicated by the block address decoded signal; h) a row address discriminating means operative to compare the row address indicated by the row address bits with the row address stored in two of the plurality of data source memorizing means associated with the memory cell block indicated by the block address decoded signal for producing a second high signal when the row addresses are consistent with one another; i) a control means operative to keep the first enable signal in inactive level in the concurrent presence of the first hit signal and the second hit signal for allowing the column selecting means to transfer the one of the data signals without read-out from the memory cell block indicated by the block address decoded signal and to produce the first enable signal and a second enable signal in the absence of at least one of the first hit signal and the second high signal; and k) a write-in means responsive to the second enable signal for writing the row address indicated by the row address bits into the data source memorizing means associated with the memory cell block indicated by the block address decoded signal.

BRIEF DESCRIPTION OF THE DRAWINGS

The features and advantages of the semiconductor random access memory device according to the present invention will be more clearly understood from the following description taken in conjunction with the accompanying drawings in which.

DESCRIPTION OF THE PREFERRED EMBODIMENTS

First Embodiment

Figure 4:
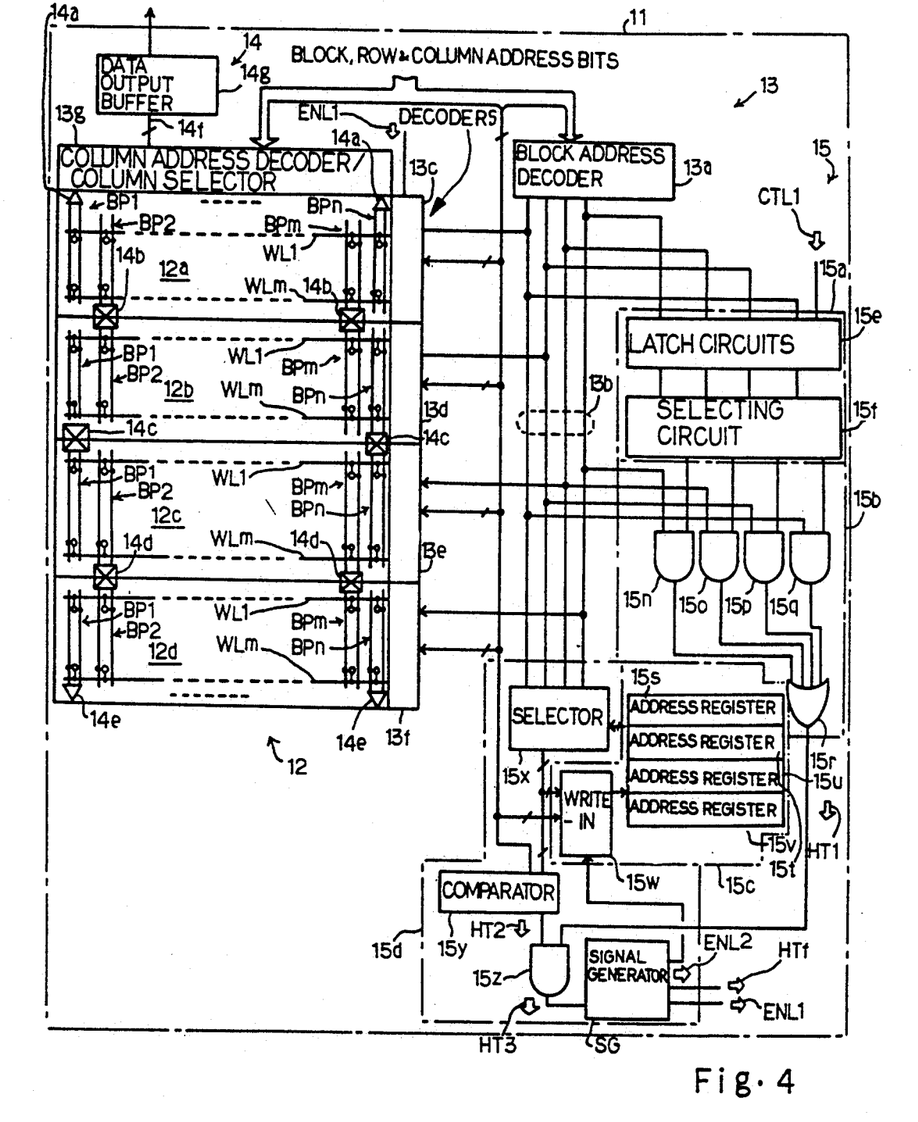
FIG. 4 is a block diagram showing the arrangement of a random access memory device according to the present invention.

Referring to FIG. 4 of the drawings, a random access memory device embodying the present invention is fabricated on a single semiconductor chip 11. The random access memory device largely comprises a memory cell array 12, an addressing system a data transferring system and a cache controlling system 15. Although the random access memory device has other component circuits such as an address buffer, a pre-charging circuit, a write-in data amplifier and a timing controller, they are deleted from FIG. 4 for the sake of simplicity.

The memory cell array 12 is implemented by four memory cell blocks 12a, 12b, 12c and 12d, and each of the memory cell blocks 12a to 12d has a plurality of memory cells arranged in rows and columns. The memory cells are of the random access type, and small bubbles are represented by small bubbles, respectively. The four memory cell blocks 12a to 12d are respectively assigned block addresses. Moreover, the rows of memory cells of each memory cell block 12a, 12b, 12c or 12d are assigned row addresses, and the row addresses are identical between the corresponding rows of the four memory cell blocks 12a to 12d. Similarly, column addresses are assigned to the columns of memory cells of each memory cell block 12a, 12b, 12c or 12d, and the column addresses are identical between the corresponding columns of the four memory cell blocks 12a to 12d.

The addressing system 13 are broken down into a block selecting sub-system, a row selecting sub-system and a column selecting sub-system, and the block selecting sub-system, the row selecting sub-system and the column selecting sub-system allow an external device such as, for example, a microprocessor (not shown), to selectively access data bits stored in the memory cell array 12 in a direct or indirect fashion.

The block selecting sub-system has a block address decoder 13a and four block address decoded signal lines 13b. Block address bits are supplied to the block address decoder 13a, and the block address decoder 13a decodes the block address bits for selectively driving the block address decoded signal lines 13b with a block address decoded signal. The block address decoded signal is indicative of a memory cell block selected by the external device.

The row selecting sub-system has four row address decoders 13c, 13d, 13e and 13f and four sets of word lines WL1 to WLm. The four row address decoders 13c to 13f and the four sets of word lines WL1 to WLm are respectively associated with the four memory cell blocks 12a to 12d, and the word lines WL1 to WLm of each memory cell block are coupled with the rows of memory cells, respectively. The row address decoders 13c to 13f are responsive to a first enable signal ENL1, and one of the row address decoders 13c to 13f indicated by the block address decoded signal becomes responsive to row address bits. In other words, the row address decoders 13c to 13f are selectively activated in the concurrent presence of the first enable signal ENL1 and the block address decoded signal, and decode the row address bits for selectively driving the word lines WL1 to WLm of the associated memory cell blocks 12a to 12d. While a word line is driven to active level, data bits are writeable from and readable into the associated memory cells.

The column selecting sub-system has a column address decoder and a column selector which are labeled with 13g in FIG. 4. The column address decoder/selector 13g is responsive to column address bits, and selects one of the columns of memory cells from the selected memory cell block.

The data transferring system 14 has four sets of bit line pairs BP1, BP2, BPm and BPn, five sense amplifier circuit arrays 14a, 14b, 14c, 14d and 14e, a data bus 14f and a data output buffer 14g. The four sets of bit line pairs BP1 to BPn are respectively associated with the four memory cell blocks 12a to 12d. Each of the bit line pairs BP1 to BPn is associated with two columns of memory cells, and propagates a data bit in the form of differential voltage from one of the associated memory cells to the associated sense amplifier circuit array.

A plurality of sense amplifier circuits are incorporated in each of the sense amplifier circuit arrays 14a to 14e, and the sense amplifier circuits of each array 14b, 14c or 14d are shared between two memory cell blocks 12a/12b, 12b/12c or 12c/12d. The sense amplifier circuits of the array 14a are coupled with every other bit line pair associated with the memory cell block 12a, and the sense amplifier circuits of the array 14e are coupled with every other bit line pair associated with the memory cell block 12d. Each of the sense amplifier circuits of the array 14b is shared between two bit line pairs of the associated two memory cell blocks. For example, the leftmost sense amplifier circuit of the array 14b is coupled between the bit line pair BP2 of the memory cell block 12a and the bit line pair BP2 of the memory cell block 12b, and the rightmost sense amplifier circuit of the array 14b is provided for the bit line pair BPm of the memory cell block 12a and for the bit line pair BPm of the memory cell block 12b. Similarly, the sense amplifier circuits of the array 14c are shared between the bit line pairs of the memory cell block 12b and the bit line pairs of the memory cell blocks 12c, and the sense amplifier circuits of the array 14d are shared between the bit line pairs of the memory cell block 12c and the bit line pairs of the memory cell block 12d. For this reason, the sense amplifier circuits of the array 14b, 14c or 14d are coupled with the bit line pairs of one of the two memory cell blocks, and develop differential voltages indicative of data bits on the bit line pairs. The sense amplifier circuits holds the differential voltages until small differential voltages are newly supplied thereto.

As described hereinbefore, the column address decoder/selector 13g selects one of the columns of memory cells from the selected memory cell block. One of the word lines WL1 to WLm allows a memory cell of the selected memory cell block to supply a data bit through the associated bit line pair to the sense amplifier circuit in so far as the sense amplifier circuit holds a data bit read out from the other memory cell block, and the sense amplifier circuit supplies the differential voltage indicative of the data bit through the column address decoder/selector 13g to the data output buffer 14g. However, if the sense amplifier circuit has already held the data bit, the data bit is directly supplied from the sense amplifier circuit through the column address decoder/selector 13g to the data output buffer 14g without any precharging and selecting a row of memory cells. The data output buffer 14g produces an output data signal indicative of the data bit from the differential voltage, and supplies the output data signal to the external device. The read-out from a memory cell and the read-out from a sense amplifier circuit hereinbelow refer to as "indirect data access" and "direct data access", respectively.

The cache controlling system 15 largely comprises a flag unit 15a, a block address discriminating unit 15b, a row address storage unit 15c and a controlling unit 15d, and the cache controlling system 15 decides which data access, i.e., the direct data access or the indirect data access to take.

Figure 5:
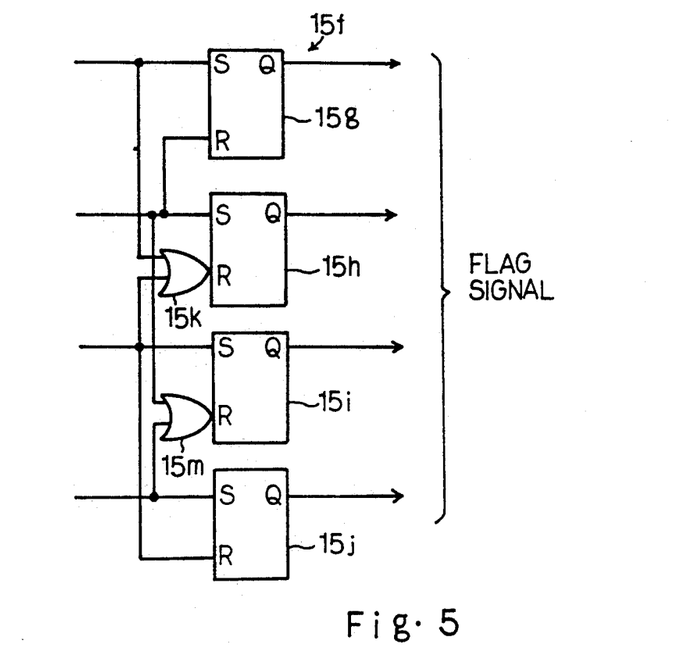
FIG. 5 is a circuit diagram showing a flag control circuit incorporated in the random access memory device according to the present invention.

The flag unit 15a comprises a plurality of latch circuits 15e responsive to a latch control signal CTL1, and a flag control circuit 15f coupled with the latch circuits 15e for producing a flag signal indicative of directly accessible memory cell block or blocks 12a to 12d. The latch control signal CTL1 is produced at every access, and allows the latch circuits 15e to store the block address decoded signal newly decoded by the block address decoder 13a. FIG. 5 shows the circuit arrangement of the flag control circuit 15f, and the flag control circuit 15f comprises four R-S flip-flop circuits 15g, 15h, 15i and 15j and two OR gates 15k and 15m. The output ports of the latch circuits 15e are respectively coupled with the set nodes of the R-S flip-flop circuits 15g to 15j, and the reset nodes of the R-S flip-flop circuits 15g and 15j are coupled with the set nodes of the R-S flip-flop circuits 15h and 15i. The set nodes of the R-S flip-flop circuits 15g and 15i and the set nodes of the R-S flip-flop circuits 15h and 15j are respectively coupled with the input nodes of the OR gate 15k and the input nodes of the OR gate 15m, and the R-S flip-flop circuits 15g to 15j enter the set-state if either R-S flip-flop circuit 15g or 15i and either R-S flip-flop circuit 15h or 15j are shifted to the set-state. While the R-S flip flop circuit remains in the set-state, the associated bit of the flag signal is indicative of the allowability of direct data access to the associated memory cell block. For example, if a data bit was read out from the memory cell block 12b, the bit of the block address decoded signal indicative of the memory cell block 12b was latched by the latch circuits 15e, and data bits concurrently read out from a row of memory cells have been stored in the sense amplifier circuit arrays 14b and 14c. The latch circuits 15e caused the R-S flip-flop circuit 15h to enter the set state, and the adjacent R-S flip flop circuits 15g and 15i were kept in or changed to the reset state. The bit of the flag signal produced by the R-S flip flop circuit 15h is indicative of the allowability of the direct data access, because the sense amplifier circuit arrays 14b and 14c stores the data bits supplied from the memory cell block 12b. However, the bits of the flag signal produced by the R-S flip-flop circuits 15g and 15i are indicative of the prohibition or the direct data access, because the sense amplifier circuit arrays 14b and 14c are not available. Thus, the four-bit flag signal are indicative of the allowability of the direct data access to the associated memory cell blocks 12a to 12d. In the following description, the bit of logic "1" level and the bit of logic "0" level are respectively indicative of the allowability and the prohibition.

Turing back to FIG. 4 of the drawings, the block address discriminating unit 15b comprises four AND gates 15n, 15o, 15p and 15q and an OR gate 15r, and the four AND gates have respective input nodes coupled with the four R-S flip-flop circuits 15g to 15j. The other input nodes of the AND gates are respectively coupled with the block address decoded signal lines. The R-S flip-flop circuits 15g to 15j produce the bits of the flag signals indicative of the allowability of the direct data access. Therefore, if the block address decoded signal is indicative of the allowable memory cell block again, the accessed data bit can be supplied from the associated sense amplifier circuit array to the outside thereof, and the access speed is improved. In case of the flag signal indicative of the allowability of the direct data access to the memory cell block 12b, the AND gate 15p is supplied with the bit of the flag signal of logic "1" level, and the adjacent AND gates 15o and 15q are respectively supplied with the bits of logic "0" level. If the block address decoded signal is indicative of the memory cell block 12b, the block address decoded signal lines supplies logic "1" to the AND gate 15p, and, accordingly, the OR gate 15r produces a first hit signal HT1 of logic "1" level. However, if the block address decoded signal is indicative of either memory cell block 12a or 12c, the block address decoded signal lines supplies logic "0" to the AND gate 15p, and the AND gates 15o and 15q have already been supplied with the bits of the flag signal of logic "0". Therefore, any AND gate can not yield logic "1" level, and the OR gate does not produce the first hit signal HT1 of logic "1" level.

The row address storage unit 15c comprises four address registers 15s, 15t, 15u and 15v and a write-in circuit 15w. The four address registers 15s to 15v are respectively associated with the four memory cell blocks 12a to 12d, and each of the four address registers 15s to 15v stores a row address selected in the previous data access to the associated memory cell block. Namely, the write-in circuit 15w writes or rewrites a row address indicated by the row address bits in the address register indicated by the block address decided signal.

The controlling unit 15d comprises a selector 15x, a comparator 15y, an AND gate 15z and a signal generator SG. The selector 15x are responsive to the block address decoded signal, and transfers the previous row address bit from one of the address registers 15s to 15v indicated by the block address decoded signal to the comparator 15y. The external row address bits are further supplied to the comparator 15y, and are compared with the previous row address supplied through the selector 15x. If the current row address bits are consistent with the previous row address bits, the comparator 15y produces a second hit signal HT2 of logic "1" level. The first and second hit signals HT1 and HT2 are supplied to the AND gate 15z, and the AND gate 15z yields a third hit signal HT3 of logic "1" level in the concurrent presence of the first hit signal HT1 of logic "1" level and the second hit signal HT2 of logic "1" level. The third hit signal HT3 of logic "1" level is indicative of the permission of the direct data access, and the third hit signal HT3 of logic "1" level triggers the signal generator SG for producing a final hit signal HTf, and the column address decoder/column selector 13g transfers an accessed data bit from one of the sense amplifier circuit array 14a to 14e to the data output buffer circuit 14g. However, the signal generator SG does not produces the first enable signal ENL1 and the internal write enable signal ENL2. On the other hand, if the AND gate 15z keeps the third hit signal HT3 in logic "0" level, the signal generator SG produces the first enable signal ENL1 and the internal write enable signal ENL2 and supplies the first enable signal ENL1 and the internal write enable signal ENL2 to the row address decoders 13c to 13f and the write-in circuit 15w.

In this instance, the comparator 15y serves as a row address discriminating means, and the AND gate 15z and the signal generator SG as a whole constitute a control means.

Description is hereinbelow made on sequential read-out operation on the assumption that a memory cell of the block 12b coupled with the word line WL1 and the bit line pair BPm is accessed in the first data access. The block address decoder 13a produces the block address decoded signal indicative of the memory cell block 12b to the row address decoder 13d, and the row address decoder 13d decodes the row address bits in the concurrent presence of the first enable signal ENL1 and the block address decoded signal indicative of the memory cell block 12b. The row address decoder 13d drives the word line WL1, and data bits are read out from the row of memory cells to the bit line pairs BP1 to BPn. The bit line pairs BP1 to BPn propagate differential voltages indicative of the read-out data bits partially to the sense amplifier circuit array 14b and partially to the sense amplifier circuit array 14c. The differential voltages are developed by the sense amplifier circuit arrays 14b and 14c. The column address decoder/column address selector 13g transfers the accessed data bit from either sense amplifier circuit array 14b or 14c to the data output buffer circuit 14g on the basis of the column address bits, and the sense amplifier circuit arrays 14b and 14c continuously store the data bits read out from the row of memory cells incorporated in the memory cell block 12b.

Moreover, the block address decoded signal is latched by the latch circuits 15e, and the R-S flip-flop circuit 15h and the R-S flip-flop circuits 15g and 15i respectively enter the set state and the reset state. For this reason, the bit of logic "1" level is supplied to the AND gate 15p, and the bits of logic "0" level are supplied to the AND gates 15o and 15q, respectively. The write-in circuit 15w writes the row address bits indicative of the word line WL1 in the address register 15t associated with the memory cell block 12b.

If the external block, row and column address bits are indicative of a memory cell of the block 12c coupled with the word line WLm and the bit line pair BP2, the block address decoder 13a produces the block address decoded signal indicative of the memory cell block 12c, and the bit of logic "1" and the bits of logic "0" are respectively supplied to the AND gate 15o and the AND gates 15p and 15q. Any AND gate is not concurrently supplied with the bits of logic "1" level, and all of the AND gates 15n to 15q keep the output signals in logic "0" level. For this reason, the OR gate 15r does not produce the first hit signal HT1 of logic "1" level.

The selector 15x selects the address register associated with the memory cell block 12c, and transfers the previous row address bits to the comparator 15y. Even if the row address bits indicative of the word line WLm is consistent with the previous row address bits, the AND gate 15z can not yield the third hit signal HT3 in the absence of the first hit signal HT1 of logic "1" level. The signal generator SG produces the first enable signal ENL1 and the internal write enable signal ENL2 instead of the final hit signal HTf. Then, the row address decoder 13e is enabled with the concurrent presence of the first enable signal ENL1 and the block address decoded signal indicative of the memory cell block 12c, and drives the word line WLm. Data bits are read out from the row of memory cells to the bit line pairs BP1 to BPn, and are transferred partially to the sense amplifier circuit array 14c and partially to the sense amplifier circuit array 14d. The differential voltages indicative of the read-out data bits are developed by the sense amplifier circuit arrays 14c and 14d, and one of the differential voltages indicative of the accessed data bit is transferred through the column address decoder/column selector 13g to the data output buffer circuit 14g. The data output buffer circuit 14g produces a output data signal indicative of the accessed data bit, and the output data signal is supplied to the external device.

If the block, row and column address bits are indicative of a memory cell of the block 12b coupled with the word line WL1 and the bit line pair BP2 in the second access, the block address decoder 13a produces the block address decoded signal indicative of the memory cell block 12b, and the bit of logic "1" is supplied from the block address decoded signal lines 13b to the AND gate 15p. The AND gate 15p produces the output signal of logic "1" level, and the OR gate yields the first hit signal HT1. The selector 15x transfers the previous row address bits indicative of the word line WL1 to the comparator 15y, and the comparator 15y compares the current row address bits indicative of the word line WL1 with the previous row address bits indicative of the word line WL1. The current row address bits are consistent with the previous row address bits, and the comparator 15y produces the second hit signal HT2 of logic "1" level. The AND gate 15z produces the third hit signal HT3 in the concurrent presence of the first hit signal HT1 of logic "1" level and the second hit signal HT2 of logic "1" level, and the signal generator SG produces the final hit signal HTf instead of the first enable signal ENL1 and the internal write enable signal ENL2. As a result, any row address decoder is enabled in the absence of the first enable signal, and the address register 15t keeps the row address bits indicative of the word line WL1. The final hit signal HTf allows the column address decoder/column selector 13g to transfer the accessed data bit from the sense amplifier circuit array 14b to the data output buffer circuit 14g, and the data output buffer circuit 14g produces the output data signal indicative of the accessed data bit.

As will be appreciated from the foregoing description, the random access memory device according to the present invention allows the shared sense amplifier circuits to directly supply the accessed data bit, and the semiconductor chip 11 and the access time are effectively decreased.

Second Embodiment

Figure 6:
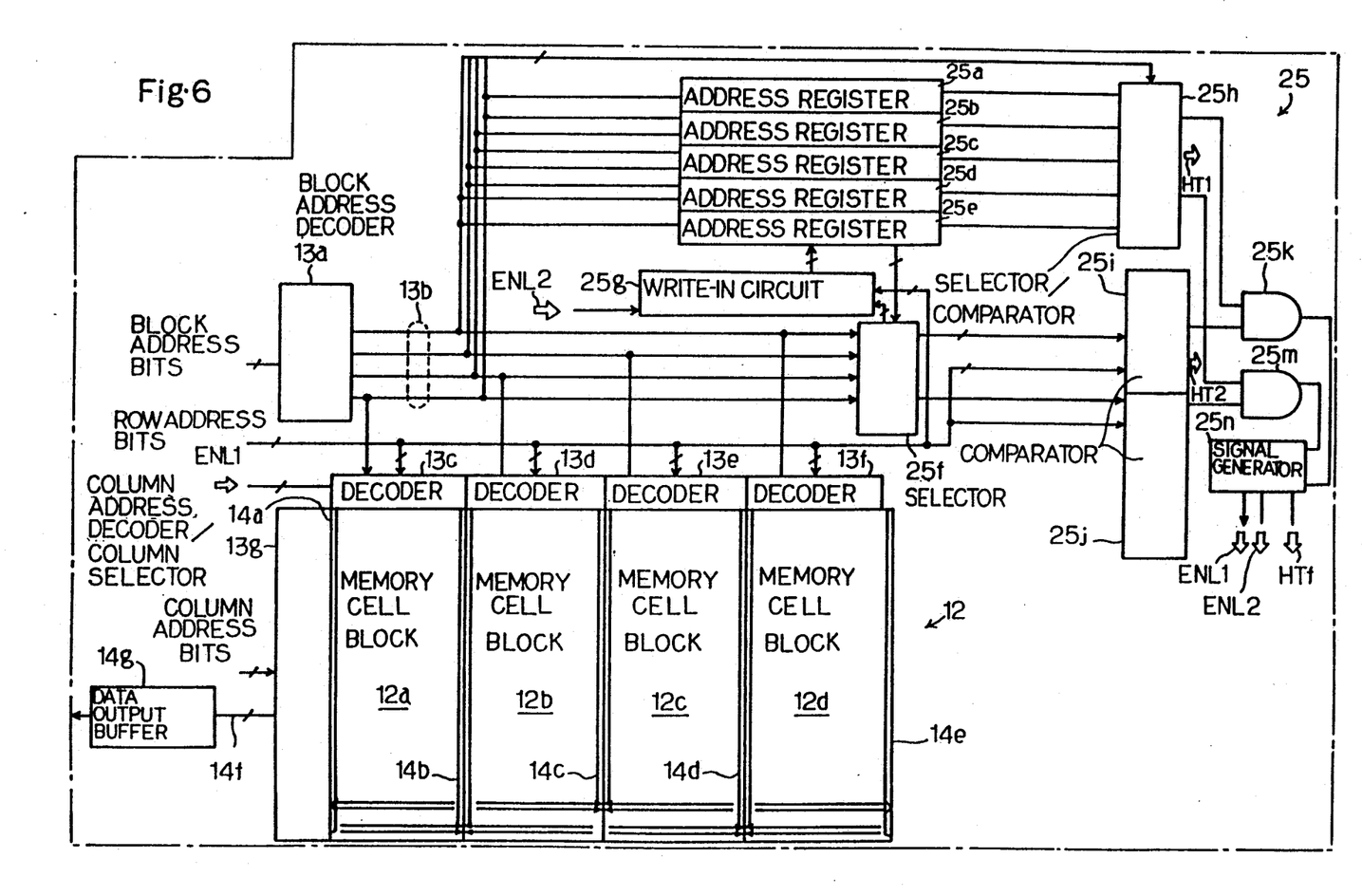
FIG. 6 is a circuit diagram showing another random access memory device according to the present invention.

Turning to FIG. 6 of the drawings, another random access memory device embodying the present invention is fabricated on a semiconductor chip 21. A memory cell array, an addressing system, a data transferring system are similar to those of the first embodiment, and the components of these systems are labeled with the same references designating the corresponding components of the first embodiment without any detailed description.

The random access memory device implementing the second embodiment further comprises a cache controlling system 25 for selecting the direct data access or the indirect data access. The cache controlling system 25 comprises five address registers 25a, 25b, 25c, 25d and 25e, a selector 25f, a write-in circuit 25g, a combined circuit 25h of selector and comparator, two comparators 25i and 25j, two AND gates 25k and 25m and a signal generator 25n.

The address registers 25a to 25e are respectively associated with the five sense amplifier circuit arrays 14a to 14e, and serve as a plurality of data source memorizing means. Each of the address registers 25a to 25e stores a row address and a block address bit of either logic "1" or "0" level. The block address bits stored in the address registers 25a and 25e are coupled with the block address decoded signal line 13b, and the sense amplifier circuit arrays 14a and 14e are exclusively used by the memory cell blocks 12a and 12d. The block address bits stored in the address registers 25b to 25d are also are changeable between logic "1" level and logic "0" level depending upon the source of data bits stored therein. If the sense amplifier circuit arrays 14b to 14d store data bits read out from the memory cell block 12a, data bits read out from the memory cell block 12b and data bits read out from the memory cell block 12c, respectively, the block address bits stored in the respective address registers 25b to 25d are logic "1" level. On the other hand, if the sense amplifier circuit arrays 14b to 14d store data bits read out from the memory cell block 12b, data bits read out from the memory cell block 12c and data bits read out from the memory cell block 12d, respectively, the block address bits stored in the respective address registers 25b to 25d are logic "0" level. The address registers 25a to 25e are responsive to the block address decoded signal for supplying two of the block address bits associated with the memory cell block indicated by the block address decoded signal to the combined circuit 25h of selector and comparator. As described in the description on the first embodiment, each of the sense amplifier circuit arrays 14a to 14e, and, for this reason, the block address decoded signal causes two of the address registers 25a to 25e associated with the selected memory cell block to supply the two block address bits to the combined circuit 25h of selector and comparator.

Figure 7:
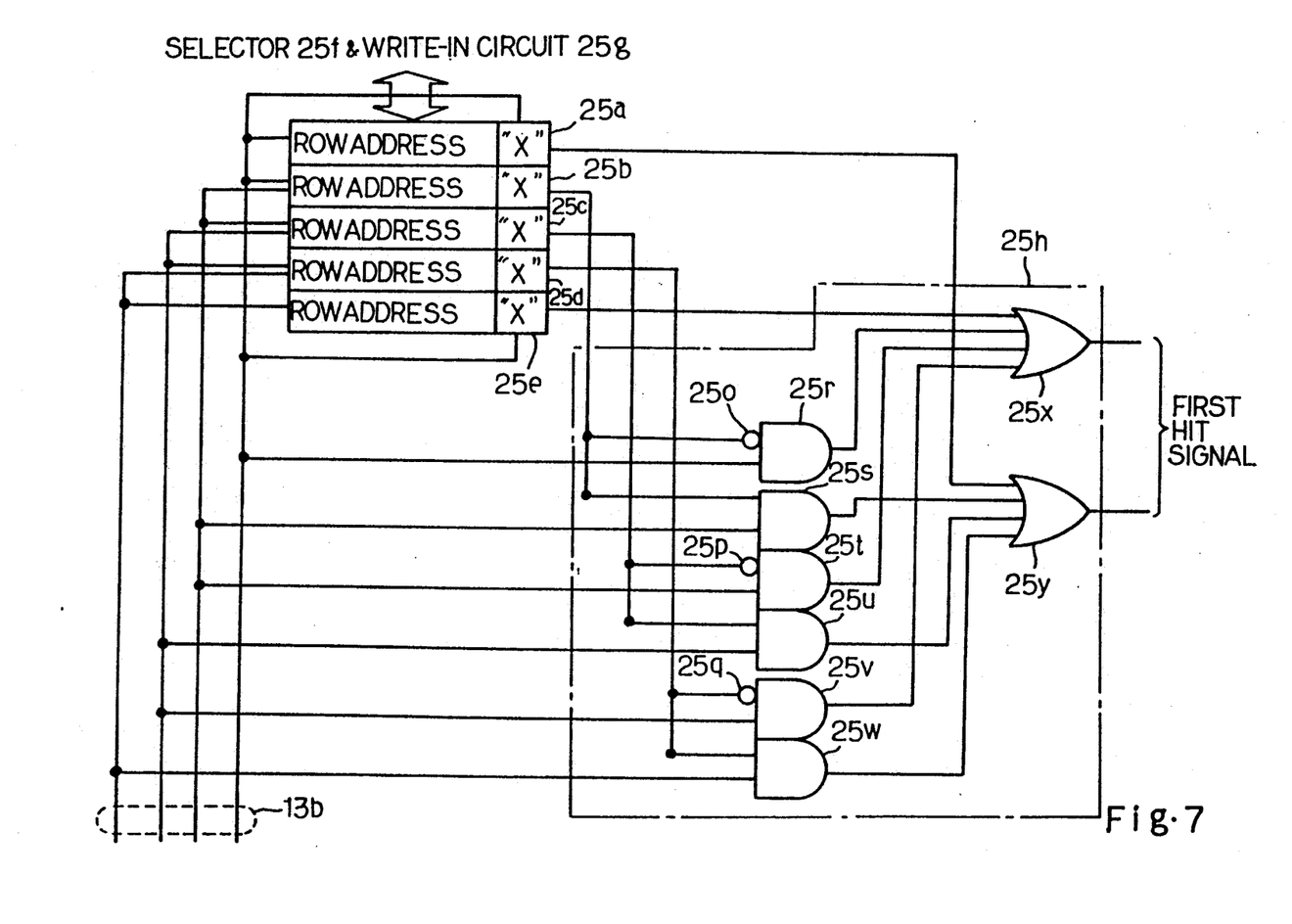
FIG. 7 is a circuit diagram showing a combined circuit of selector and comparator incorporated in the random access memory device shown in FIG. 6.

The combined circuit 25h of selector and comparator comprises inverters 24o, 25p and 25q, six AND gates 25r, 25s, 25t, 25u, 25v and 25w, and two OR gates 25x and 25y, as shown in FIG. 7. The combined circuit 25h compares the block address bits with the bits of the block address decoded signal to see whether or not the associated two sense amplifier circuit arrays stores data bits read out from the memory cell block indicated by the block address decoded signal. If the associated two sense amplifier circuit arrays store data bits read out from the selected memory cell block, the OR gates 25x and 25y produces two-bit first hit signal HT1.

The selector 25h is responsive to the block address decoded signal for transferring two row addresses from the address registers 25a to 25e associated with the memory cell block indicated by the block address decoded signal to the comparators 25i and 25j, respectively. The comparators compares the row addresses transferred from the selector 25f with the row address indicated by the row address bits. If the row addresses are consistent with one another, the comparators 25i and 25j produce two-bit second hit signal HT2 of logic "1" level. However, if not, the comparator 25i and 25j cause at least one bit of the second hit signal HT2 to remain in logic "0". The two-bit first hit signal HT1 is ANDed with the two-bit second hit signal HT2, and the signal generator 25n produces a final hit signal HTf in the concurrent presence of the two-bit first hit signal HT1 of logic "1" level and the two-bit second hit signal HT2 of logic "1" level. With the final hit signal HTf, the column address decoder/column selector 13g transfers one of the read-out data bits from one of the associated sense amplifier circuit arrays to the data output buffer circuit 14g without any precharge and any selection of a word line. However, if any one bit of the first and second hit signals HT1 and HT2 is logic "0" level, the signal generator SG produces the first enable signal ENL1 and the internal write-in enable signal ENL2, and the accessed data bit is read out from a memory cell incorporated in the memory cell block indicated by the block address decoded signal.

It is desirable for the random access memory device thus arranged to take the direct data access in view of the access speed. In order to enhance the hit ratio, the column addresses are assigned in such a manner that one of the associated sense amplifier circuit arrays is shared between the column addresses having the same higher column address bits, and continuous block addresses are not assigned to the adjacent memory cell blocks. Therefore, while the column address bits are sequentially incremented, data bits are continuously read out from the associated sense amplifier circuit, and such direct data accesses improve the access speed. If it is desirable for a computer system to distribute duplicate data to each of memory locations separated from each other, the address assignment will be changed from that of the second embodiment.

Third Embodiment

Figure 8:
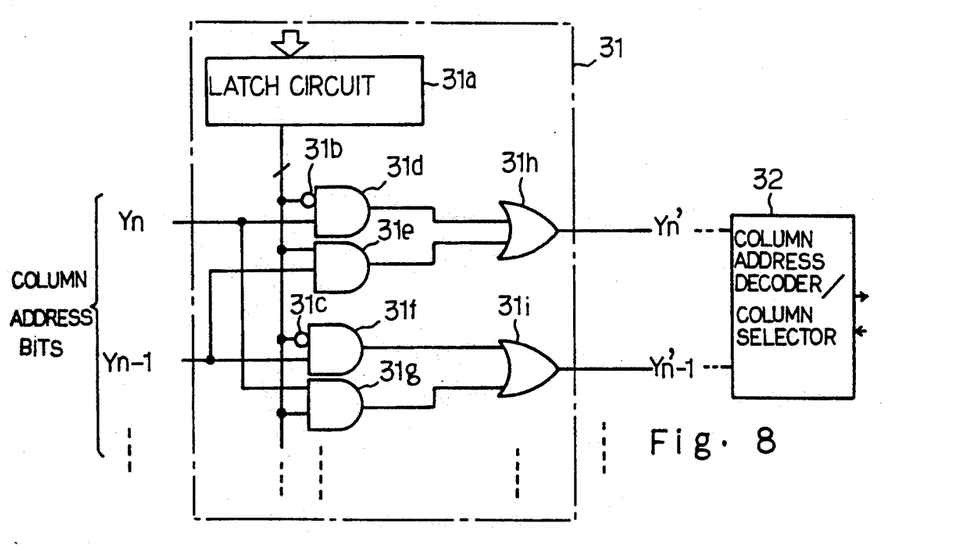
FIG. 8 is a circuit diagram showing the arrangement of an address converter incorporated in yet another random access memory device according to the present invention.

Turning to FIG. 8 of the drawings, a column address converter 31 incorporated in yet another random access memory device embodying the present invention is provided in association with a column address decoder/column selector 32. However, other circuit arrangement is similar to that of either first or second embodiment, and no further description is incorporated hereinbefore for the sake of simplicity.

The column address converter 31 comprises a latch circuit 31a, inverters 31b and 31c, AND gates 31d, 31e, 31f and 31g and OR gates 31h and 31i. Although only two column address bits Yn and Yn−1 are converted to two column address bits Y'n and Y'n−1, the column address converter 31 is responsive to more than two column address bits. The latch circuit 31a stores an external instruction signal indicative of an address mapping pattern, and the bits of the external instruction signal are selectively supplied directly to or through the inverters 31b and 31c to the AND gates 31d to 31g. Therefore, the column address bits Yn, Yn−1, ... are selectively changed in logic level, and the OR gates 31h and 31i supplies converted column address bits Y'n, Y'n−1, ... to the column address decoder/column selector 32.

Thus, the column address converter 31 maps a column address indicated by the column address bits Yn, Yn−1, ... to another column address, and arbitrary address assignment is achieved in the memory cell array by using the column address converter 31.

Although particular embodiments of the present invention have been shown and described, it will be obvious to those skilled in the art that various changes and modifications may be made without departing from the spirit and scope of the present invention. For example, a memory cell array 12 may be implemented by more than four memory cell blocks.

What is claimed is:

1. A random access memory device fabricated on a single semiconductor chip, comprising:
   a) a plurality of memory cell blocks each implemented by a plurality of memory cells arranged in rows and columns, block addresses being respectively assigned to said plurality of memory cell blocks, row addresses being respectively assigned to said rows of memory cells of each memory cell block, column addresses being respectively assigned to said columns of memory cells of each memory cell block;
   b) a block selecting means responsive to block address bits for producing a block address decoded signal indicative of the block address assigned to one of said plurality of memory cell blocks;
   c) a plurality of row selecting means respectively associated with said plurality of memory cell blocks, and selectively enabled in the concurrent presence of a first enable signal and said block address decoded signal for producing a row address decoded signal indicative of a row address assigned to one of the rows of memory cells incorporated in the associated memory cell block;
   d) a plurality of sense amplifier circuit arrays having sense amplifier circuits each array shared between two of said plurality of memory cell blocks, and each operative to amplify data signals indicative of data bits read-out from a row of memory cells of one of said plurality of memory cell blocks, said plurality of sense amplifier circuit arrays holding the data signals until data signals are newly supplied thereto;

e) a column selecting means responsive to column address bits for selecting one of said data signals held in said sense amplifier circuit arrays associated with the memory cell block indicated by said block address decoded signal;

f) a plurality of flag means respectively associated with said plurality of memory cell blocks, and operative to produce flag signals each indicative of whether or not the data bits stored in one of said plurality of sense amplifier circuit arrays are read out from the associated memory cell block;

g) a block address discriminating means operative to compare said block address decoded signal with said flag signals for producing a first hit signal when said block address decoded signal is indicative of one of said plurality of memory cell blocks which has already supplied data bits to the associated sense amplifier circuit array;

h) a plurality of address storage means respectively associated with said plurality of memory cell blocks, and each storing the row address assigned to one of said rows of memory cells selected from the associated memory cell block in the latest access;

i) a row address discriminating means operative to compare the row address indicated by said row address bits with said row address stored in each address storage means for producing a second hit signal when said row addresses are consistent with each other;

j) a control means operative to keep said first enable signal in inactive level in the concurrent presence of said first hit signal and said second hit signal for allowing said column selecting means to transfer said one of said data signals without read-out from the memory cell block indicated by said block address decoded signal and to produce said first enable signal and a second enable signal in the absence of at least one of said first hit signal and said second hit signal; and k) a write-in means responsive to said second enable signal for writing the row address indicated by said row address bits into the address storage means associated with the memory cell block designated by said block address decoded signal.

2. A random access memory device as set forth in claim 1, in which said plurality of flag means comprises latch circuits responsive to a latch control signal produced at every access for temporally storing said block address decoded signal, and a plurality of flip-flop circuits respectively associated with said plurality of memory cell blocks and having respective set nodes directly supplied with bits of said block address decoded signal and respective reset nodes supplied with different bits of said block address decoded signal directly from or indirectly through first logic gates from said latch circuits in such a manner that an access to one of said two memory cell blocks resets the other of said two memory cell blocks.

3. A random access memory device as set forth in claim 1, in which said block address discriminating means comprises a plurality of second logic gates associated with said plurality of memory cell blocks and supplied with said respective flag signals and respective bits of said block address decoded signals, and a third logic gate coupled with output nodes of said second logic gates for producing said first hit signal, one of said second logic gates allowing said third logic gate to produce said first hit signal when said flag signal indicative of allowability of access to the associated memory cell block is matched with the memory cell block indicated by said block address decoded signal.

4. A random access memory device as set forth in claim 1, in which said row address discriminating means comprises a selector responsive to said block address decoded signal for selecting one of said plurality of row address storage means, and a comparator having a first input port coupled with said selector and a second input port supplied with row address bits from which said row address decoded signal is produced, said comparator being operative to produce said second hit signal when said row address stored in said one of said plurality of row address storage means is consistent with a current row address indicated by said row address bits.

5. A random access memory device as set forth in claim 1, in which a column address converter is provided in association with said column selecting means and operative to map an external column address to an internal column address for supplying said column selecting means said column address bits produced from external column address bits indicative of said external column address.

6. A random access memory device fabricated on a single semiconductor chip, comprising:

a) a plurality of memory cell blocks each implemented by a plurality of memory cells arranged in rows and columns, block addresses being respectively assigned to said plurality of memory cell blocks, row addresses being respectively assigned to said rows of memory cells of each memory cell block, column addresses being respectively assigned to said columns of memory cells of each memory cell block;

b) a block selecting means responsive to block address bits for producing a block address decoded signal indicative of the block address assigned to one of said plurality of memory cell blocks;

c) a plurality of row selecting means respectively associated with said plurality of memory cell blocks, and selectively enabled in the concurrent presence of a first enable signal and said block address decoded signal for producing a row address decoded signal indicative of a row address assigned to one of the rows of memory cells incorporated in the associated memory cell block;

d) a plurality of sense amplifier circuit arrays having predetermined sense amplifier circuits, each array shared between two of said plurality of memory cell blocks, and each operative to amplify data signals indicative of data bits read-out from a row of memory cells of one of said plurality of memory cell blocks, said plurality of sense amplifier circuit arrays holding the data signals until data signals are newly supplied thereto;

e) a column selecting means responsive to column address bits for selecting one of said data signals held in said sense amplifier circuit arrays associated with the memory cell block indicated by said block address decoded signal;

f) a plurality of data source memorizing means respectively associated with said plurality of sense amplifier circuit arrays, and storing respective row addresses assigned to rows of memory cells each selected in the latest access to the associated memory cell block and respective address codes indicative of memory cell blocks respectively containing said rows of memory cells;

g) a block address discriminating means operative to compare said block address decoded signal with said address codes to see whether or not said plurality of sense amplifier circuit arrays store the data signals indicative of data bits read out from the memory cell block indicated by said block address decoded signal, said block address discriminating means producing a first hit signal when said plurality of sense amplifier circuit arrays store the data signals indicative of the data bits read out from the memory cell block indicated by said block address decoded signal;

h) a row address discriminating means operative to compare the row address indicated by said row address bits with the row address stored in two of said plurality of data source memorizing means associated with the memory cell block indicated by said block address decoded signal for producing a second hit signal when said row addresses are consistent with one another;

i) a control means operative to keep said first enable signal in inactive level in the concurrent presence of said first hit signal and said second hit signal for allowing said column selecting means to transfer said one of said data signals without read-out from the memory cell block indicated by said block address decoded signal and to produce said first enable signal and a second enable signal in the absence of at least one of said first hit signal and said second high hit signal; and k) a write-in means responsive to said second enable signal for writing the row address indicated by said row address bits into the data source memorizing means associated with the memory cell block indicated by said block address decoded signal.

7. A random access memory device as set forth in claim 6, in which said plurality of data source memorizing means are implemented by address registers each having a first memory area assigned one of said row addresses and a second memory area assigned one of said block address codes, said first area of each address register being coupled with said write-in means for rewriting the row address stored therein, said second area of each address register being coupled with one of block address decoded signal lines propagating said block address decoded signal for changing the block address code stored therein.

8. A random access memory device as set forth in claim 7, in which said block address discriminating means is implemented by a plurality of logic gates coupled with the second areas of said address registers and said block address decoded signal lines for producing said first hit signal.

9. A random access memory device as set forth in claim 7, in which said row address discriminating means comprises a selector responsive to said block address decoded signal for selecting two of the first areas of said address registers, a first comparator having a first input port supplied with the row address from one of said two first areas and a second input port supplied with external row address bits from which said row address decoded signal is produced, and a second comparator having a first input port supplied with the row address from the other of said two first areas and a second input port supplied with said external row address bits.

10. A random access memory device as set forth in claim 6, in which a column address converter is provided in association with said column selecting means and operative to map an external column address to an internal column address for supplying said column selecting means said column address bits produced from external column address bits indicative of said external column address.

* * * * *

UNITED STATES PATENT AND TRADEMARK OFFICE
CERTIFICATE OF CORRECTION

PATENT NO. : 5,301,162

DATED : April 5, 1994

INVENTOR(S) : Tamio SHIMIZU

It is certified that error appears in the above-identified patent and that said Letters Patent is hereby corrected as shown below:

Col. 13, line 4, after "each" insert --of the memory cell blocks 25a to 25e is associated with two--.

Col. 17, line 34, delete "high".

Signed and Sealed this

Twenty-seventh Day of September, 1994

Attest:

BRUCE LEHMAN

Attesting Officer     Commissioner of Patents and Trademarks